United States Patent
Hu et al.

(10) Patent No.: US 10,348,271 B2
(45) Date of Patent: Jul. 9, 2019

(54) IMPEDANCE MATCHING CIRCUITS AND INTERFACE CIRCUITS

(71) Applicant: MediaTek Singapore Pte. Ltd., Singapore (SG)

(72) Inventors: Bo Hu, Hefei (CN); Kun Lan, Hefei (CN)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/867,117

(22) Filed: Jan. 10, 2018

(65) Prior Publication Data

US 2018/0254767 A1 Sep. 6, 2018

(30) Foreign Application Priority Data

Mar. 3, 2017 (CN) .......................... 2017 1 0123202

(51) Int. Cl.
| | |
|---|---|
| *H03H 11/28* | (2006.01) |
| *H03K 17/687* | (2006.01) |
| *H03K 19/00* | (2006.01) |
| *H03K 19/003* | (2006.01) |
| *H03K 19/0185* | (2006.01) |

(52) U.S. Cl.
CPC .......... *H03H 11/28* (2013.01); *H03K 17/687* (2013.01); *H03K 19/00* (2013.01); *H03K 19/00361* (2013.01); *H03K 19/018564* (2013.01)

(58) Field of Classification Search
CPC .............................. H03H 11/28; H03K 17/687
See application file for complete search history.

(56) References Cited

U.S. PATENT DOCUMENTS

| | | | |
|---|---|---|---|
| 7,064,576 B1 | 6/2006 | Maangat | |
| 8,890,601 B2 * | 11/2014 | Li | .......................... H03F 1/223 |
| | | | 326/30 |
| 2014/0139046 A1 | 5/2014 | Chowdary et al. | |

* cited by examiner

*Primary Examiner* — Jung Kim
(74) *Attorney, Agent, or Firm* — McClure, Qualey & Rodack, LLP

(57) ABSTRACT

An impedance matching circuit and an interface circuit are provided. The impedance matching circuit includes a reference-voltage generation circuit, a control-signal generation circuit, and a circuit subunit. The reference-voltage generation circuit generates a reference voltage. The control-signal generation circuit generates a plurality of control signals. The circuit subunit is coupled to the reference-voltage generation circuit and the control-signal generation circuit. The circuit subunit receives the reference voltage and the control signals. The circuit subunit includes a plurality of transistors. The plurality of transistors are turned on or off according to levels of the control signals, and the plurality of transistors provide an impedance which matches the impedance of a receiver when the interface circuit is powered. The reference voltage is provided to bulks of the transistors, so that the voltages of the bulks of the transistors are not equal to zero volts.

20 Claims, 6 Drawing Sheets

IMPEDANCE MATCHING CIRCUITS AND INTERFACE CIRCUITS

CROSS REFERENCE TO RELATED APPLICATIONS

This Application claims priority of China Patent Application No. 201710123202.9, filed on Mar. 3, 2017, the entirety of which is incorporated by reference herein.

BACKGROUND OF THE INVENTION

Field of the Invention

The invention relates to an impedance matching circuit, and more particularly to an impedance matching circuit for a high-definition multimedia interface (HDMI) transmitter, which not only can effectively achieve impedance matching with the HDMI receiver but also can effectively protect the transistors of the HDMI transmitter from high voltages.

Description of the Related Art

Due to developments in digital signal processing technologies and digital coding formats of video and audio signals, the distribution of digital television signals has become increasingly widespread. At this time, high-resolution displays are widely available on the market. In order to meet the requirements for interconnection between high-resolution displays and digital signal sources, a digital transmission interface specification has been developed; specifically, the high-definition multimedia interface (HDMI).

The HDMI is an audio/video signal interface used to transmit uncompressed data. An HDMI transmitter (abbreviated as TX) and an HDMI receiver (abbreviated as RX) are connected to each other through electrical wires.

FIG. 1 shows a HDMI transmitter and an HDMI receiver in a traditional technique. An HDMI transmitter (HDMI_TX) 10 and an HDMI receiver (HDMI_RX) 20 are connected to each other through electrical wires. DP_DRV and DN_DRV are input terminals for receiving differential input signals. Since the transistors manufactured by the 18IO manufacturing process only withstand a maximum voltage of 1.8 volts, the HDMI transmitter 10 is limited to the structure shown in FIG. 1 in the traditional technique, wherein an impedance matching circuit 100 is not coupled to a system high voltage of 3.3 volts, so that the transistors do not need to withstand the system high voltage of 3.3 volts.

However, in the traditional structure, since the voltage swing specified by the HDMI specification is not fully applied, the impedance provided by the impedance matching circuit 100 cannot achieve a matching state of 50 Ohm. In order to solve the problem of impedance matching, when the limitation on the withstand voltage of the transistors is taken into consideration, a new impedance matching circuit is required for an HDMI transmitter, which can effectively achieve impedance matching and also effectively protect the transistors from excessively high voltages, so that the electronic elements can be prevented from becoming damaged by excessively high voltages.

BRIEF SUMMARY OF THE INVENTION

Thus, an impedance matching circuit and an interface circuit are provided for solving the problems experienced using the traditional technique.

An exemplary embodiment of an impedance matching circuit for an interface circuit is provided. The impedance matching circuit comprises a reference-voltage generation circuit, a control-signal generation circuit, and a circuit subunit. The reference-voltage generation circuit generates a reference voltage. The control-signal generation circuit generates a plurality of control signals. The circuit subunit is coupled to the reference-voltage generation circuit and the control-signal generation circuit. The circuit subunit receives the reference voltage and the plurality of control signals. The circuit subunit comprises a plurality of transistors. The plurality of transistors are turned on or off according to the plurality of control signals, and the plurality of transistors provide an impedance which matches an impedance of a receiver when the interface circuit is powered. The reference voltage is supplied to the bulk of the plurality of transistors, to control the voltage on the bulk of the plurality of transistors to be non-zero.

An exemplary embodiment of an interface circuit is provided. The interface circuit comprises a differential amplifier and the above impedance matching circuit. The differential amplifier comprises a first input terminal and a second input terminal which receive a pair of differential input signals and further comprises a first output terminal and a second output terminal which output a pair of differential output signals.

According to the embodiments of the invention, better impedance matching is provided for a transmitter which applies the above impedance matching circuit, and the transistors in the transmitter can effectively protect the transistors of the transmitter from excessively high voltages, so that the electronic elements can be prevented from becoming damaged by excessively high voltages.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. The scope of the invention is best determined by reference to the appended claims.

Figure 1:
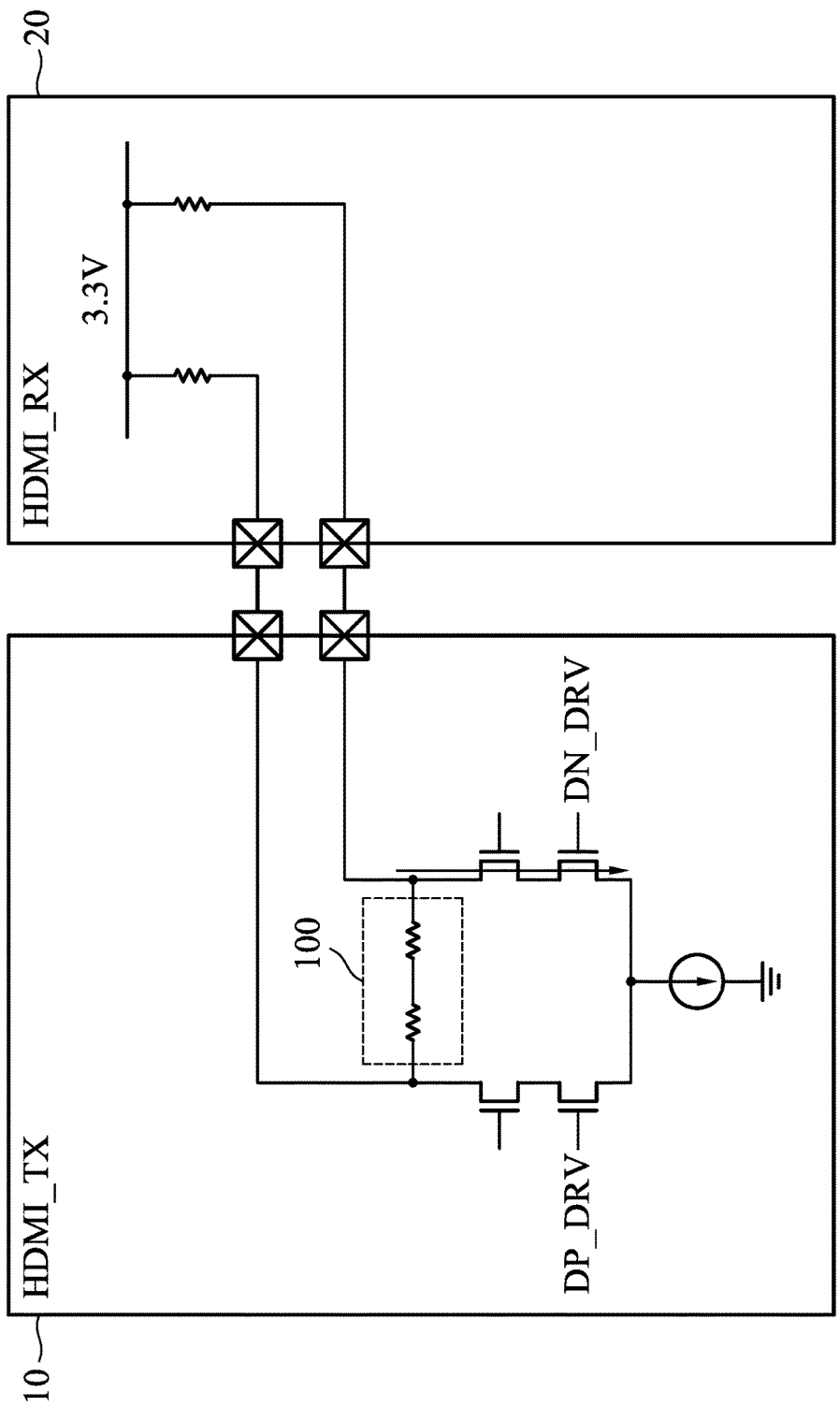
FIG. 1 shows a HDMI transmitter and an HDMI receiver in traditional technique.
Figure 2:
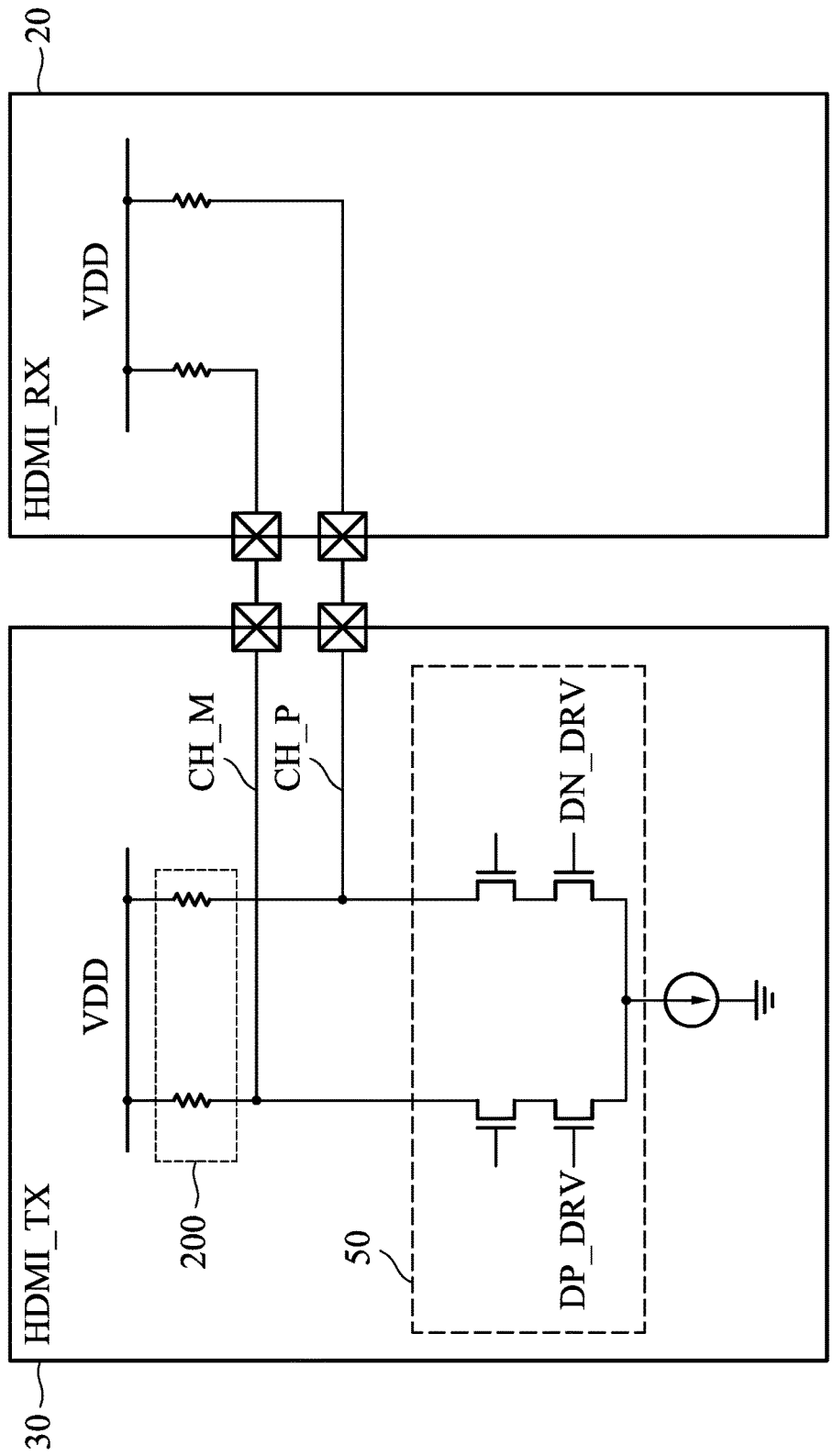
FIG. 2 shows an exemplary embodiment of an interface circuit for a transmitter and a receiver.

FIG. 2 shows an exemplary embodiment of an interface circuit for a transmitter and a receiver. In the embodiment, the interface circuit may be a high-definition multimedia interface (HDMI) circuit. Thus, FIG. 2 shows a block of an interface circuit for an HDMI transmitter and an HDMI receiver. According to the embodiment, the interface circuit of the HDMI transmitter (HDMI_TX) 30 may comprise a differential amplifier 50 and an impedance matching circuit 200. The differential amplifier 50 comprises input terminals DN_DRV and DP_DRV for receiving a pair of differential input signals and output terminals CH_M and CH_P for outputting a pair of differential output signals. The impedance matching circuit 200 provides an impedance which matches the impedance of the HDMI receiver (HDMI_RX) 20. The HDMI transmitter 30 and the HDMI receiver 20 are connected to each other through electrical wires.

It is worth noting that the impedance matching circuit 200 shown in FIG. 2 which comprises resistors and switch elements is a schematic diagram for illustration of the invention. The circuit structure of the impedance matching circuit is shown in the later paragraphs and described in detail.

In the embodiment, the impedance matching circuit 200 may be coupled to a voltage source VDD. The voltage source VDD provides a system high voltage, such as a system high voltage of 3.3 volts. Through appropriate design of the circuit structure of the impedance matching circuit 200, the internal electronic elements would not be damaged due to withstanding the high voltage, even if the impedance matching circuit 200 is coupled to the voltage source VDD. Moreover, when appropriate design of the circuit structure of the impedance matching circuit 200 is provided, the problem of leakage current flowing from the HDMI receiver 20 back to the HDMI transmitter 30 can be solved. In the traditional technique, when an HDMI transmitter is not powered or its power source is turned off and, at the same time, an HEM receiver is inserted into the HDMI transmitter, a current flows from the HDMI receiver back to the HDMI transmitter by passing the output terminals CH_M and CH_P, thereby causing leakage current in the HDMI transmitter. However, according to the embodiment, the impedance matching circuit 200 can effectively block the leakage current when the HDMI transmitter is not powered or its power source is turned off, so as to prevent the electronic elements from being damaged by the leakage current.

Moreover, compared with the traditional technique in which the voltage swing is not fully applied and thus the impedance matching circuit cannot provide a matched impedance of 50 Ohm, in the embodiment, the voltage swing specified by the HDMI specification can be fully applied, and the impedance matching circuit 200 can provide a matched impedance of 50 Ohm.

Figure 3:
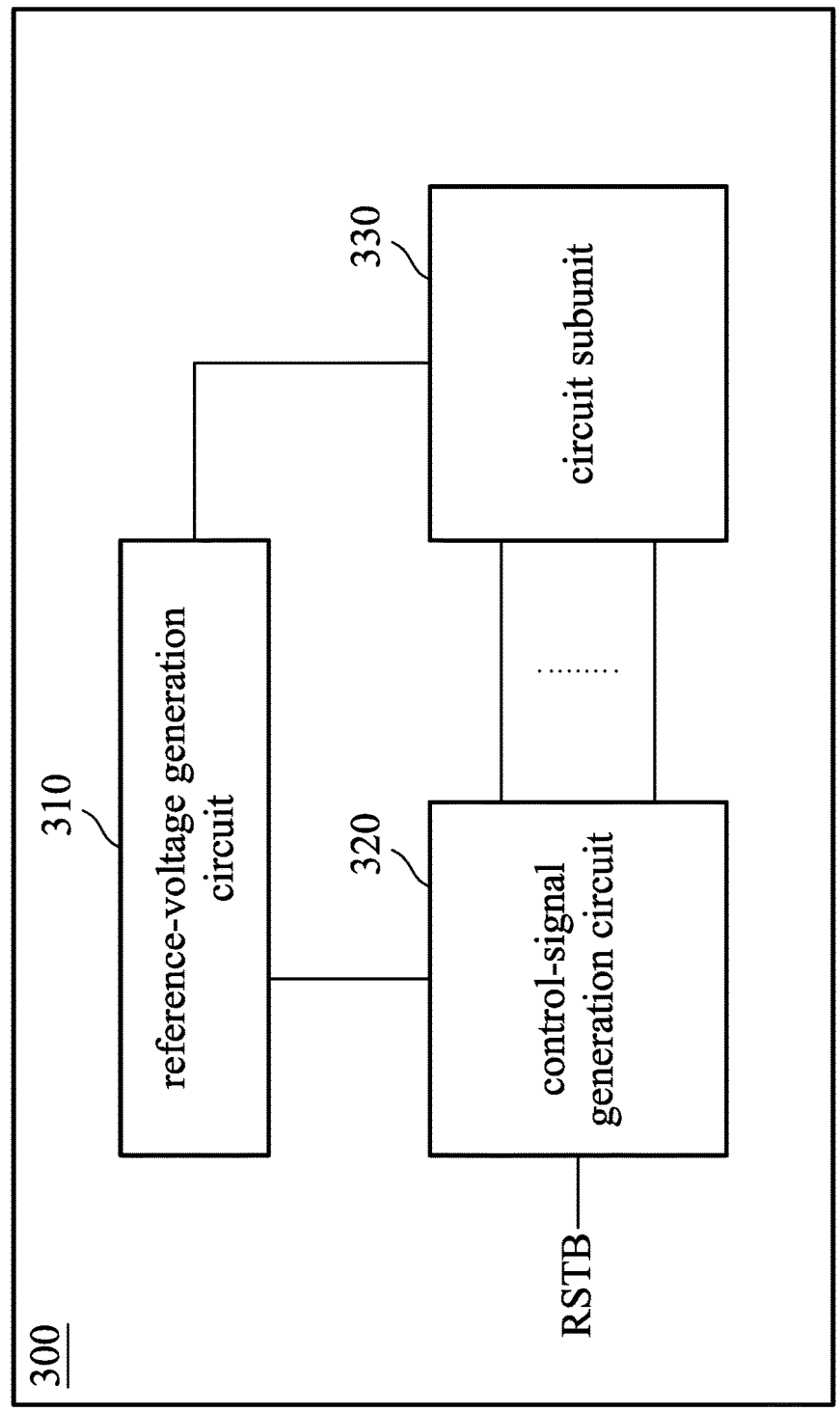
FIG. 3 shows a block diagram of an exemplary embodiment of an impedance matching circuit.

FIG. 3 shows a block diagram of an exemplary embodiment of an impedance matching circuit. An impedance matching circuit 300 may comprise a reference-voltage generation circuit 310, a control-signal generation circuit 320, and a circuit subunit 330. The reference-voltage generation circuit 310 generates a reference voltage Vnwell. The control-signal generation circuit 320 generates a plurality of control signals according to the reference voltage Vnwell and a power-ready signal RSTB. The power-ready signal RSTB indicates the power state of the HDMI transmitter. For example, in cases where the HDMI transmitter is powered, this means that the power state of the HDMI transmitter is a ready state. At this time, a voltage source VDD has a non-zero voltage, and the power-ready signal RSTB is set to a high voltage level. In cases where the HDMI transmitter is not powered, this means that the power state of the HDMI transmitter is an unready state. At this time, the voltage of the voltage source VDD is zero volts, and the power-ready signal RSTB is set to a low voltage level.

The circuit subunit 330 is coupled to the reference-voltage generation circuit 310 and the control-signal generation circuit 320 and operates to receive the reference voltage Vnwell and the control signals. According to the embodiment, the circuit subunit 330 may comprise a plurality of transistors. The plurality of transistors are turned on or off according to the voltage levels of the control signals, so that the impedance matching circuit 300 can provide a matched impedance of 50 Ohm when the HDMI transmitter is powered. Moreover, through providing the reference voltage Vnwell to one or more transistors among the plurality of transistors, the bulk voltage of the one or more transistors is controlled to be not equal to zero volts when the HDMI transmitter is not powered and the HDMI receiver is inserted into the HDMI transmitter, thereby solving the aforementioned problem of leakage current. This is because there is a parasitical PN diode formed on each of the junction between the drain and the bulk of the PMOS transistor and the junction between the source and the bulk of the PMOS transistor. Moreover, the bulk voltage needs to be switched between a voltage induced when the transmitter is powered while the receiver is not powered and another value induced when the transmitter is not powered while the receiver is powered, so that the parasitical diode coupled to the voltage source VDD is prevented from being turned on, thereby avoiding the leakage current back to the transmitter. In the embodiment, the transistors are implemented by, for example, PMOS transistors, however, the invention is not limited thereto.

Figure 4:
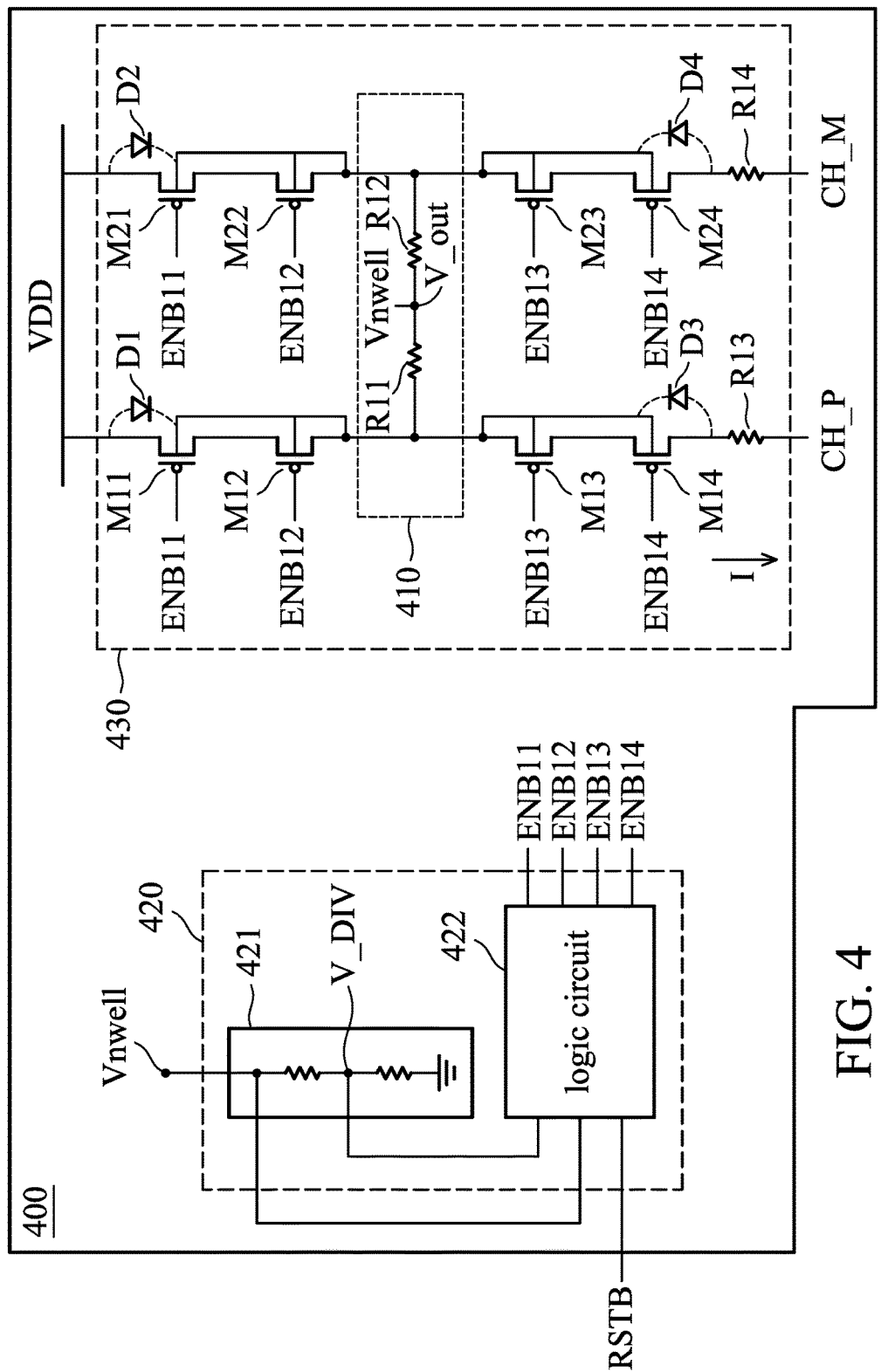
FIG. 4 shows a circuit diagram of an impedance matching circuit according to the first exemplary embodiment.

FIG. 4 shows a circuit diagram of an impedance matching circuit according to the first exemplary embodiment. An impedance matching circuit 400 may comprise a reference-voltage generation circuit 410, a control-signal generation circuit 420, and a circuit subunit 430. The circuit subunit 430 may comprise a plurality of PMOS transistors M11, M12, M13, and M14 (that is, a first set of transistors), a plurality of PMOS transistors M21, M22, M23, and M24 (that is, a second set of transistors), and resistors R13 and R14. The transistors M11, M12, M13, and M14 are coupled in series between a voltage source VDD and an output terminal CH_P. The transistors M21, M22, M23, and M24 are coupled in series between the voltage source VDD and an output terminal CH_M.

The reference-voltage generation circuit 410 is coupled between the transistors M12, M13, M22, and M23. The reference-voltage generation circuit 410 operates to obtain common-mode signals generated between the transistors and further average the common-mode signals to generate the reference voltage. The reference-voltage generation circuit 410 may comprise resistors R11 and R12. One terminal of the resistor R11 is coupled between the transistors M12 and M13. One terminal of the resistor R12 is coupled between the transistors M22 and M23. The joint node between the resistors R11 and R12 serves as a reference-voltage output terminal V_out for outputting a reference voltage Vnwell.

According to the embodiment, the gates of the PMOS transistors M11~M14 and the gates of the PMOS transistors M21~M24 receive control signals ENB11, ENB12, ENB13, and ENB 14, respectively. The drain of the PMOS transistor M11 is coupled to the source of the PMOS transistor M12. The bulk of the PMOS transistor M11 and the bulk of the PMOS transistor M12 are coupled together and then coupled to the drain of the PMOS transistor M12. The connection between the PMOS transistor M21 and the PMOS transistor M22 is the same as the connection between the PMOS transistor M11 and the PMOS transistor M12. The drain of the PMOS transistor M21 is coupled to the source of the PMOS transistor M22. The bulk of the PMOS transistor M21 and the bulk of the PMOS transistor M22 are coupled together and then coupled to the drain of the PMOS transistor M22. Similarly, the drain of the PMOS transistor M13 is coupled to the source of the PMOS transistor M14. The bulk of the PMOS transistor M13 and the bulk of the PMOS transistor M14 are coupled together and then coupled to the source of the PMOS transistor M13. The connection between the PMOS transistor M23 and the PMOS transistor M24 is the same as the connection between the PMOS transistor M13 and the PMOS transistor M14. The drain of the PMOS transistor M23 is coupled to the source of the PMOS transistor M24. The bulk of the PMOS transistor M23 and the bulk of the PMOS transistor M24 are coupled together and then coupled to the source of the PMOS transistor M23. In the embodiment, the PMOS transistors M11 and M21 are implemented, for example, by a plurality of transistors which are coupled in parallel and controlled by a plurality of parallel control signals ENB11.

The control-signal generation circuit 420 comprises a voltage dividing circuit 421 and a logic circuit 422. The voltage dividing circuit 421 may be coupled to the reference-voltage output terminal V_out of the reference-voltage generation circuit 410 to receive the reference voltage Vnwell and generate a voltage V_DIV. The logic circuit 422 receives the reference voltage Vnwell, the voltage V_DIV, and a power-ready signal RSTB and performs a logic operation to generate the control signals ENB11, ENB12, ENB13, and ENB14. The control signals ENB11, ENB12, ENB13, and ENB14 are provided to the circuit subunit 430 for controlling the states of the transistors M11~M14 and M21~M24.

According to the embodiment, when the HDMI transmitter is powered (that is, when the voltage source VDD provides a high voltage, for example 3.3V (volt)), the system high voltage passes down from the voltage source VDD through the parasitical diode formed on the junctions between the drains and the bulks and the junctions between the sources and the bulks of the PMOS transistors M11, M12, M21, and M22, and then the reference voltage Vnwell is pulled up. Specifically, as indicated by dotted lines in FIG. 4, there is a parasitical diode D1 formed between the source and the bulk of the PMOS transistor M11 and there is a parasitical diode D2 formed between the source and the bulk of the PMOS transistor M21. Moreover, there are parasitical diodes (not shown) formed between the drains and the bulks of the PMOS transistors M12 and M22. When the voltage source VDD provides a high voltage, the parasitical diodes D1 and D2 are turned on, and the voltages on the drains of the PMOS transistors M12 and M22 are equal to the voltage VDD minus the voltage drop on the parasitical diode, thereby pulling up the reference voltage Vnwell to a high voltage.

After the reference voltage Vnwell is pulled up, the control-signal generation circuit 420 then starts to operate and generates corresponding control signals ENB11, ENB12, ENB13, and ENB14 to control the transistors M11, M12, M13, M14, M21, M22, M23, and M24 to be turned on. At this time, the turn-on resistances of the transistors M11, M12, M13, M14, M21, M22, M23, and M24 and the resistors R13 and R14 form a matched impedance of 50 Ohm.

When the transistors M11 and M12 are turned on, the voltage difference between the source of the transistor M11 and the drain of the transistor M12 is equal to I*(Ron_M11+Ron_M12)*0.5 which is smaller than 0.7 (the turn-on voltage of the diode) (i.e., I*(Ron_M11+Ron_M12)*0.5<0.7), wherein I represents the current flowing from the voltage source VDD to the output terminal CH_P, Ron_M11 represents the turn-on resistance of the transistor M11 when the transistor M11 is turned on, and Ron_M12 represents the turn-on resistance of the transistor M12 when the transistor M12 is turned on. Thus, the parasitical diode D1 is turned off, and the circuit subunit 430 can operate normally. Similarly, when the transistors M21 and M22 are turned on, the parasitical diode D2 is turned off. Since the voltage drop which is induced when the transistor M11 and the transistor M12 are turned on is smaller than the turn-on voltage of the diode, the parasitical diodes D1, and D2 are not turned on, and the circuit subunit 430 operates normally.

When the HDMI transmitter is not powered and the power source of the HDMI receiver is turned on and the HDMI transmitter is coupled to the HDMI receiver, then the voltages seen by the output terminals CH_P and CH_M are the system high voltage of the HDMI receiver, such as 3.3V, and the voltage of the voltage source VDD of the HDMI transmitter is 0V. At this time, the reference-voltage; generation circuit 410 generates the reference voltage Vnwell according to the voltages of the output terminals CH_P and CH_M.

Specifically, as shown by the dotted lines in FIG. 4, there is a parasitical diode D3 formed between the drain and the bulk of the PMOS transistor M14, and there is a parasitical diode D4 formed between the drain and bulk of the PMOS transistor M24. Moreover, there are parasitical diodes (not shown) formed between the sources and the bulks of the PMOS transistors M13 and M23. The high voltages on the output terminals CH_P and CH_M (that is, the voltages fed back by the HDMI receiver) pass up through the parasitical diodes D3 and D4 to pull up the reference voltage Vnwell. At this time, the reference voltage Vnwell is equal to a voltage obtained by subtracting the voltage drops of the diodes D3 and D4 from 0.5*(VCH_M+VCH_P), wherein VCH_M represents the voltage of the output terminal CH_M, and VCH_P represents the voltage of the output terminal CH_P.

Since the reference voltage Vnwell is pulled up, the control-signal generation circuit 420 then continuously generates the corresponding control signals to control the transistors M11 and M21 to be turned on and further control the transistors M12 and M22 to be turned off. The turned-off transistors M12 and M22 can intercept the leakage current flowing from the HDMI receiver back to the transmitter, so that the leakage current cannot flow to the voltage source VDD anymore. Moreover, the turned-on transistors M11 and M21 can prevent the transistors M12 and M22 from being directly coupled to the VDD voltage of 0 volts, thereby enhancing the reliability of the circuit. Since the transistors manufactured by the 18IO manufacturing process are limited to only withstand a maximum voltage of 1.8 volts, the transistors cannot directly withstand the system high voltage of 3.3 volt. Thus, the current path is cut off by the turned-off transistors M12 and M22, and the reliability of the circuit is enhanced by turning on the transistors M11 and M12.

Through the above circuit design, the transistors disposed in the inside of the impedance matching circuit 400 can be protected appropriately, and they do not need to withstand excessively high voltages. Moreover, through the above circuit design, the leakage current flowing from the HDMI receiver back to the HDMI transmitter can be solved. In the embodiment, the reference voltage Vnwell on the bucks can be obtained from the voltage source VDD or the voltages of the output terminals CH_M and CH_P. Thus, the reference voltage Vnwell is a floating voltage. Through the above design, the circuit subunit 430 can operate normally.

Figure 5:
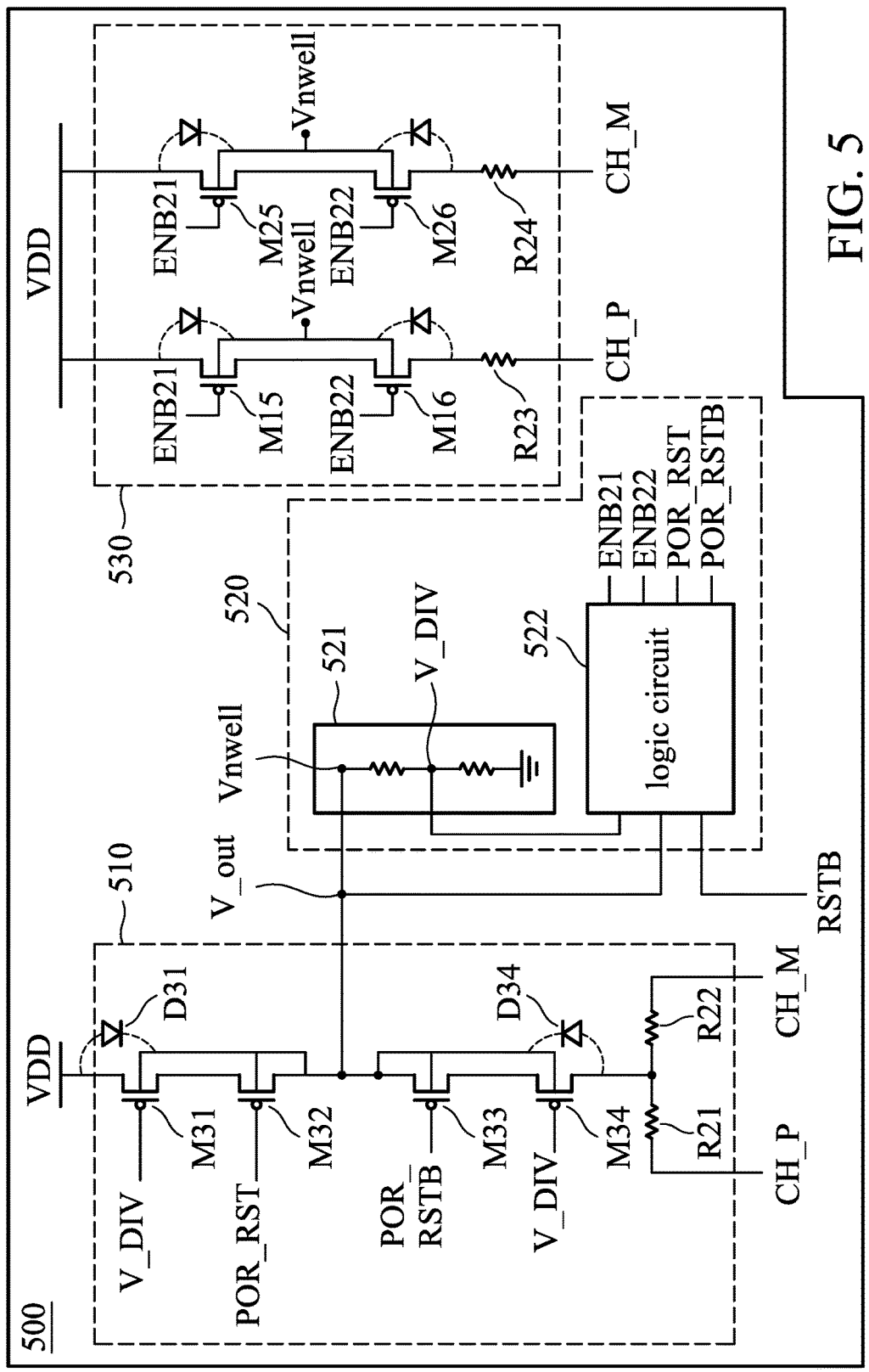
FIG. 5 shows a circuit diagram of an impedance matching circuit according to the second exemplary embodiment.

FIG. 5 shoes circuit diagram of an impedance matching circuit according to the second exemplary embodiment. An impedance matching circuit 500 may comprise a reference-voltage generation circuit 510, a control-signal generation circuit 520, and a circuit subunit 530. The circuit subunit 530 may comprise a plurality of PMOS transistors M15 and M16 (that is, a first set of transistors), a plurality of PMOS transistors M25 and M26 (that is, a second set of transistors), and resistors R23 and R24. The transistors M15 and M16 are coupled in series between a voltage source VDD and an output terminal CH_P. The transistors M25 and M26 are coupled in series between the voltage source VDD and an output terminal CH_M. Each of the first set of transistors and the second set of transistors may comprise several sets of transistors which are coupled in parallel to provide more accurate matched impedance.

The reference-voltage generation circuit 510 may comprise resistors R21 and R22 and PMOS transistors M31, M32, M33, and M34. One terminal of the resistor R21 is coupled to the output terminal CH_P. The resistor R22 is coupled between the other terminal of the resistor R21 and the output terminal CH_M. The transistors M31, M32, M33, and M34 are coupled in series between the voltage source VDD and the joint node of the resistors R21 and R22. The joint node between the transistors M32 and M33 serves as a reference-voltage output terminal V_out for outputting a reference voltage Vnwell.

According to the embodiment, the gates of the PMOS transistors M15 and M25 and the gates of the PMOS transistors M16 and M26 receive control signals ENB21 and ENB22, respectively. The drain of the PMOS transistor M15 is coupled to the source of the PMOS transistor M16. The bulk of the PMOS transistor M15 and the bulk of the PMOS transistor M16 are coupled together and then coupled to the reference voltage Vnwell. The connection between the PMOS transistor M25 and the PMOS transistor M26 is the same as the connection between the PMOS transistor M15 and the PMOS transistor M16. The drain of the PMOS transistor M25 is coupled to the source of the PMOS transistor M26. The bulk of the PMOS transistor M25 and the bulk of the PMOS transistor M26 are coupled together and then coupled to the reference voltage Vnwell.

The control-signal generation circuit 520 comprises a voltage dividing circuit 521 and a logic circuit 522. The voltage dividing circuit 521 may be coupled to the reference-voltage output terminal V_out of the reference-voltage generation circuit 510 to receive the reference voltage Vnwell and generate a voltage V_DIV. The logic circuit 522 receives the reference voltage Vnwell, the voltage V_DIV, and a power-ready signal RSTB and performs a logic operation to generate the control signals ENB21, ENB22, POR_RST, and POR_RSTB. The control signals ENB21 and ENB22 are provided to the circuit subunit 530 for controlling the states of the transistors M15 and M16 and the states of the transistors M25 and M26. The control signals POR_RST and POR_RSTB and the voltage V_DIV are provided to the reference-voltage generation circuit 510 to control the states of the transistors M31, M32, M33, and M34.

According to the embodiment, when the HDMI transmitter is powered (that is, when the voltage source VDD provides a high voltage, for example 3.3V (volt)), the system high voltage passes down from the voltage source VDD through the parasitical diodes of the transistors M31 and M32, and then the reference voltage Vnwell is pulled up.

Specifically, as indicated by dotted lines in FIG. 5, there is a parasitical diode D31 formed between the source and the bulk of the PMOS transistor M31, and there is a parasitical diode D34 formed between the drain and the bulk of the PMOS transistor M34. Moreover, there are parasitical diodes (not shown) formed between the drain and the bulk of the PMOS transistor M32 and between the source and the bulk of the PMOS transistor M33. When the voltage source VDD provides a high voltage, the parasitical diode D31 is turned on, and the voltage on the drain of the PMOS transistor M32 is equal to the voltage obtained by subtracting the voltage drop of the parasitical diode from the voltage VDD, thereby pulling up the reference voltage Vnwell to a high voltage.

After the reference voltage Vnwell is pulled up, the control-signal generation circuit 520 then starts to operate and generates corresponding control signals POR_RST and POR_RSTB to control the transistors M31 and M32 to be turned on and further control the transistor M33 to be turned-off. After the transistors M31 and M32 are turned on, the reference voltage Vnwell can be pulled up to be close to the system high voltage of 3.3V. At this time, according to the above description, the parasitical diode D31 and the parasitical diode formed between the drain and the bulk of the PMOS transistor M32 are turned off.

Moreover, the control-signal generation circuit 520 may further comprise the control signals ENB21 and ENB22 to control the transistors M15, M16, M25, and M26 to be turned on. At this time, the turn-on resistances of the transistors M15, M16, M25, and M26 and the resistances of the resistors R23 and R24 form a matched impedance of 50 Ohm.

When the HDMI transmitter is not powered (i.e., the voltage of the voltage source VDD of the HDMI transmitter is 0V) and the power source of the HDMI receiver is turned on and the HDMI transmitter is coupled to the HDMI receiver, then the voltages seen by the output terminals CH_P and CH_M are the system high voltage of the HDMI receiver, such as 3.3V. At this time, the reference-voltage generation circuit 510 generates the reference voltage Vnwell according to the voltages of the output terminals CH_P and CH_M.

Specifically, the high voltages on the output terminals CH_P and CH_M (that is, the voltages fed back by the receiver) pass up through the parasitical diode D34 and the parasitical diode formed between the source and the bulk of the transistor M33, thereby pulling up the reference voltage Vnwell.

Since the reference voltage Vnwell is pulled up, the control-signal generation circuit 520 then continuously generates the corresponding control signals to control the transistors M31, M33, and M34 to be turned on and further control the transistor M32 to be turned off. The turned-on transistors M33 and M34 can pull the reference voltage Vnwell up to be close to the system high voltage of 3.3V, for example, Vnwell=0.5*(VCH_M+VCH_P). The turned-off transistors M32, M16, and M26 can intercept the leakage current flowing from the firm receiver back to the HDMI transmitter, so that the leakage current cannot flow to the voltage source VDD anymore. Moreover, the turned-on transistors M31, M15, and M25 can prevent the transistor M32, M16, and M26 from being directly coupled to the VDD voltage of 0 volts, thereby enhancing the reliability of the circuit.

Through the above circuit design, the transistors disposed in the inside of the impedance matching circuit 500 can be protected appropriately, and they do not need to withstand excessively high voltages. Moreover, through the above circuit design, the leakage current flowing from the HDMI receiver back to the HDMI transmitter can be prevented. In the embodiment, the reference voltage Vnwell can be obtained from the voltage source VDD or the voltages of the output terminals CH_M and CH_P. Thus, the reference voltage Vnwell is a floating voltage. Through the above design, the circuit subunit 530 can operate normally.

Figure 6:
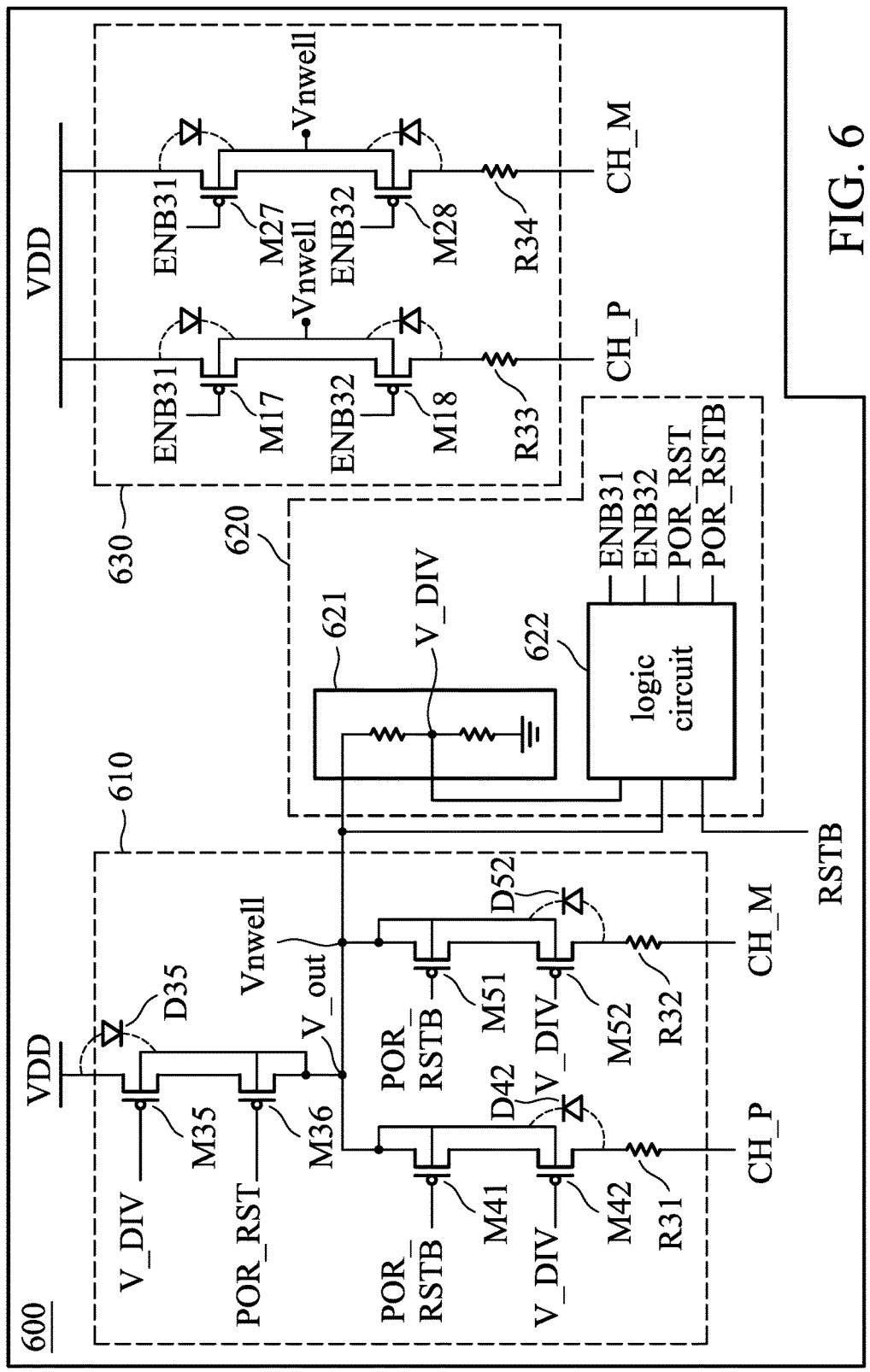
FIG. 6 shows a circuit diagram of an impedance matching circuit according to the third exemplary embodiment.

FIG. 6 shows the circuit diagram of the impedance latching circuit according to the third exemplary embodiment. An impedance matching circuit 600 may comprise a reference-voltage generation circuit 610, a control-signal generation circuit 620, and a circuit subunit 630. The circuit subunit 630 may comprise a plurality of PMOS transistors M17 and M18 (that is, a first set of transistors), a plurality of PMOS transistors M27 and M28 (that is, a second set of transistors), and resistors R33 and R34. The transistors M17 and M18 are coupled in series between a voltage source VDD and an output terminal CH_P. The transistors M27 and M28 are coupled in series between the voltage source VDD and an output terminal CH_M.

The reference-voltage generation circuit 610 may comprise resistors R31 and R32, PMOS transistors M35 and M36 (that is, a third set of transistors), PMOS transistors M41 and M42 (that is, a fourth set of transistors), and PMOS transistors M51 and M52 (that is, a fifth set of transistors). One terminal of the resistor R31 is coupled to the output terminal CH_P. One terminal of the resistor R32 is coupled to the output terminal CH_M. The transistors M35 and M36 are coupled in series between the voltage source VDD and a reference-voltage output terminal V_out which is used to output a reference voltage Vnwell. The transistors M41 and M42 are coupled in series between the reference-voltage output terminal V_out and the other terminal of the resistor R31. The transistors M51 and M52 are coupled in series between the reference-voltage output terminal V_out and the other terminal of the resistor R32.

According to the embodiment, the gates of the PMOS transistors M17 and M27 and the gates of the PMOS transistors M18 and M28 receive control signals ENB31 and ENB32, respectively. The drain of the PMOS transistor M17 is coupled to the source of the PMOS transistor M18. The bulk of the PMOS transistor M17 and the bulk of the PMOS transistor M18 are coupled together and then coupled to the reference voltage Vnwell. The connection between the PMOS transistor M27 and the PMOS transistor M28 is the same as the connection between the PMOS transistor M17 and the PMOS transistor M18. The drain of the PMOS transistor M27 is coupled to the source of the PMOS transistor M28. The bulk of the PMOS transistor M27 and the bulk of the PMOS transistor M28 are coupled together and then coupled to the reference voltage Vnwell.

The control-signal generation circuit 620 comprises a voltage dividing circuit 621 and a logic circuit 622. The voltage dividing circuit 621 may be coupled to the reference-voltage output terminal V_out of the reference-voltage generation circuit 610 to receive the reference voltage Vnwell and generate a voltage V_DIV. The logic circuit 622 receives the reference voltage Vnwell, the voltage V_DIV, and a power-ready signal RSTB and performs a logic operation to generate the control signals ENB31, ENB32, POR_RST, and POR_RSTB. The control signals ENB31 and ENB32 are provided to the circuit subunit 630 for controlling the states of the transistors M17 and M18 and the states of the transistors M27 and M28. The control signals POR_RST and POR_RSTB and the voltage V_DIV are provided to the reference-voltage generation circuit 610 to control the states of the transistors M35, M36, M41, M42, M51, and M52.

According to the embodiment, when the HDMI transmitter is powered (that is, when the voltage source VDD provides a high voltage, for example 3.3V (volt)), the system high voltage passes down from the voltage source VDD through the parasitical diodes of the transistors M35 and M36, and then the reference voltage Vnwell is pulled up. Specifically, as indicated by dotted lines in FIG. 6, there is a parasitical diode D35 formed between the source and the bulk of the PMOS transistor M35. Moreover, there is parasitical diode (not shown) formed between the drain and the bulk of the PMOS transistor M36. When the voltage source VDD provides a high voltage, the parasitical diode D35 is turned on, and the voltage on the drain of the PMOS transistor M36 is equal to the voltage obtained by subtracting the voltage drop of the parasitical diode from the voltage VDD, thereby pulling up the reference voltage Vnwell to a high voltage.

After the reference voltage Vnwell is pulled up, the control-signal generation circuit 620 then starts to operate and generates corresponding control signals POR_RST and POR_RSTB to control the transistors M35 and M36 to be turned on and further control the transistors M41 and M51 to be turned-off. After the transistors M35 and M36 are turned on, the reference voltage Vnwell can be pulled up to be close to the system high voltage of 3.3V. At this time, according to the above description, the parasitical diode D35 and the parasitical diode formed between the drain and the bulk of the PMOS transistor M36 are turned off.

Moreover, the control-signal generation circuit 620 may further generate the control signals ENB31 and ENB32 to control the transistors M17, M18, M27, and M28 to be turned on. At this time, the turn-on resistances of the transistors M17, M18, M27, and M28 and the resistances of the resistors R33 and R34 form a matched impedance of 50 Ohm.

When the HDMI transmitter is not powered (i.e., the voltage of the voltage source VDD of the HDMI transmitter is 0V) and the power source of the HDMI receiver is turned on and the HDMI transmitter is coupled to the HDMI receiver, then the voltages seen by the output terminals CH_P and CH_M are the system high voltage of the HDMI receiver, such as 3.3V. At this time, the reference-voltage generation circuit 610 generates the reference voltage Vnwell according to the voltages of the output terminals CH_P and CH_M.

Specifically, the high voltages on the output terminals CH_P and CH_M (that is, the voltages fed back by the HDMI receiver) pass up through the parasitical diodes of the transistors M41, M42, M51, and M52, thereby pulling up the reference voltage Vnwell. As shown by the dotted lines of FIG. 6, there is a parasitical diode D42 formed between the drain and the bulk of the PMOS transistor M42, and there is a parasitical diode D52 formed between the drain and bulk of the PMOS transistor M52. Moreover, there are parasitical diodes (not shown) formed between the sources and the bulks of the PMOS transistors M41 and M51. The high voltages on the output terminals CH_P and CH_M (that is, the voltages fed back by the HDMI receiver) pass up through the parasitical diodes D42 and D52 and the parasitical diodes formed between the sources and the bulks of the PMOS transistors M41 and M51 to pull up the reference voltage Vnwell.

Since the reference voltage Vnwell is pulled up, the control-signal generation circuit 620 then continuously generates the corresponding control signals to control the transistors M17, M27, M35, M41, M42, M51, and M52 to be turned on and further control the transistors M36, M18, and M28 to be turned off. The turned-on transistors M41, M42, M51, and M52 can pull the reference voltage Vnwell up to be close to the system high voltage of 3.3V, for example, Vnwell=0.5*(VCH_M+VCH_P). The turned-off transistors M36, M18, and M28 can intercept the leakage current flowing from the HDMI receiver back to the HDMI transmitter, so that the leakage current cannot flow to the voltage source VDD anymore. Moreover, the turned-on transistor M35 can prevent the transistor M36 from being directly coupled to the VDD voltage of 0 volts, thereby enhancing the reliability of the circuit.

Through the above circuit design, the transistors disposed in the inside of the impedance matching circuit 600 can be protected appropriately, and they do not need to withstand excessively high voltages. Moreover, through the above circuit design, the leakage current flowing from the HDMI receiver back to the HDMI transmitter can be prevented. In the embodiment, the reference voltage Vnwell can be obtained from the voltage source VDD or the voltages of the output terminals CH_M and CH_P. Thus, the reference voltage Vnwell is a floating voltage. Through the above design, the circuit subunit 630 can operate normally.

Moreover, compared with the traditional technique in which the voltage swing is not fully applied and, thus, the impedance provided by the impedance matching circuit 100 cannot achieve a matching state of 50 Ohm, according to the various embodiments, the voltage swing specified by the HDMI specification can be fully applied, and the impedance matching circuit can provide a matching state of 50 Ohm, thereby solving the problems experienced using the traditional technique.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (hut for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An impedance matching circuit for an interface circuit, comprising:
    a reference-voltage generation circuit generating a reference voltage;
    a control-signal generation circuit generating a plurality of control signals; and
    a circuit subunit, coupled to the reference-voltage generation circuit and the control-signal generation circuit, receiving the reference voltage and the plurality of control signals,
    wherein the circuit subunit comprises a plurality of transistors, and the plurality of transistors are turned on or off according to the plurality of control signals, and by turning on or off the plurality of transistors, an impedance of the interface circuit is matched with an impedance of a receiver when the interface circuit is powered and the leakage current flowing from the receiver to the interface circuit is intercepted when the interface circuit is not powered,
    wherein the reference voltage is supplied to the bulk of the plurality of transistors, to control the voltage on the bulk of the plurality of transistors to be non-zero.

2. The impedance matching circuit as claimed in claim 1, wherein the control-signal generation circuit generates the plurality of control signals according to the reference voltage and a power-ready signal which indicates a power state of the interface circuit.

3. The impedance matching circuit as claimed in claim 1, wherein when the interface circuit is not powered, the reference-voltage generation circuit generates the reference voltage according to the voltage on a first output terminal and a second output terminal of the interface circuit.

4. The impedance matching circuit as claimed in claim 1, wherein the circuit subunit comprises:
    a first set of transistors coupled between a voltage source and a first output terminal; and
    a second set of transistors coupled between the voltage source and a second output terminal.

5. The impedance matching circuit as claimed in claim 4, wherein each of the first set of transistors and the second set of transistors comprises a first transistor, a second transistor, a third transistor, and a fourth transistor which are coupled in series, a bulk of the first transistor and a bulk of the second transistor are coupled to a drain of the second transistor, and a bulk of the third transistor and a bulk of the fourth transistor are coupled to a source of the third transistor.

6. The impedance matching circuit as claimed in claim 4, wherein each of the first set of transistors and the second set of transistors comprises a first transistor and a second transistor which are coupled in series, a bulk of the first transistor and a bulk of the second transistor are coupled together to receive the reference voltage.

7. The impedance matching circuit as claimed in claim 5, wherein the reference-voltage generation circuit comprises:
    a first resistor, a first terminal of the first resistor coupled between the second transistor and the third transistor in the first set of transistors; and
    a second resistor, a first terminal of the second resistor coupled between the second transistor and the third transistor in the second set of transistors,
    wherein a joint node of the second terminal of the first resistor and the second terminal of the second resistor is coupled to a reference-voltage output terminal which is used to output the reference voltage.

8. The impedance matching circuit as claimed in claim 5, wherein when the interface circuit is not powered and another interface circuit which is powered is coupled to the interface circuit, the first transistor, the third transistor, and the fourth transistor in each of the first set of transistors and the second set of transistors are turned on, and the second transistor in each of the first set of transistors and the second set of transistors is turned off.

9. The impedance matching circuit as claimed in claim 6, wherein when the interface circuit is not powered and another interface circuit which is powered is coupled to the interface circuit, the first transistor is turned on, and the second transistor is turned off.

10. The impedance matching circuit as claimed in claim 4, wherein the reference-voltage generation circuit comprises:
    a first resistor coupled to a first output terminal;

a second resistor coupled between the first resistor and a second output terminal; and
a third set of transistors coupled between a voltage source and a joint node between the first resistor and the second resistor,
wherein the third set of transistors comprises a first transistor, a second transistor, a third transistor, and a fourth transistor which are coupled in series, a bulk of the first transistor and a bulk of the second transistor are coupled to a drain of the second transistor, and a bulk of the third transistor and a bulk of the fourth transistor are coupled to a source of the third transistor, and
wherein a joint node between the second transistor and the third transistor is coupled to a reference-voltage output terminal which is used to the reference voltage.

11. The impedance matching circuit as claimed in claim 4, wherein the reference-voltage generation circuit comprises:
a first resistor coupled to a first output terminal;
a second resistor coupled to a second output terminal; and
a third set of transistors coupled between a voltage source and a reference-voltage output terminal which is used to output the reference voltage, wherein the third set of transistors comprises a first transistor and a second transistor which are coupled in series, and a bulk of the first transistor and a bulk of the second transistor are coupled to a drain of the second transistor;
a fourth set of transistors coupled between the reference-voltage output terminal and the first resistor; and
a fifth set of transistors coupled between the reference-voltage output terminal and the second resistor, wherein each of the fourth set of transistors and the fifth set of transistors comprises a third transistor and a fourth transistor which are coupled in series, and a bulk of the third transistor and a bulk of the fourth transistor are coupled to a source of the third transistor.

12. An interface circuit, comprising:
a differential amplifier comprising a first input terminal and a second input terminal which receive a pair of differential input signals and further comprising a first output terminal and a second output terminal which output a pair of differential output signals; and
an impedance matching circuit, for providing matched impedance at the first output terminal and the second output terminal, wherein the impedance matching circuit comprises:
a reference-voltage generation circuit generating a reference voltage;
a control-signal generation circuit generating a plurality of control signals; and
a circuit subunit, coupled to the reference-voltage generation circuit and the control-signal generation circuit, receiving the reference voltage and the plurality of control signals,
wherein the circuit subunit comprises a plurality of transistors, and the plurality of transistors are turned on or off according to the plurality of control signals, and by turning on or off the plurality of transistors, an impedance of the interface circuit is matched with an impedance of a receiver when the interface circuit is powered and the leakage current flowing from the receiver to the interface circuit is intercepted when the interface circuit is not powered,
wherein the reference voltage is supplied to the bulk of the plurality of transistors, to control the voltage on the bulk of the plurality of transistors to be non-zero.

13. The interface circuit as claimed in claim 12, wherein when the interface circuit is not powered, the reference-voltage generation circuit generates the reference voltage according to the voltage on the first output terminal and the second output terminal of the interface circuit.

14. The interface circuit as claimed in claim 12, wherein the circuit subunit comprises:
a first set of transistors coupled between a voltage source and the first output terminal; and
a second set of transistors coupled between the voltage source and the second output terminal.

15. The interface circuit as claimed in claim 14, wherein each of the first set of transistors and the second set of transistors comprises a first transistor, a second transistor, a third transistor, and a fourth transistor which are coupled in series, a bulk of the first transistor and a bulk of the second transistor are coupled to a drain of the second transistor, and a bulk of the third transistor and a bulk of the fourth transistor are coupled to a source of the third transistor.

16. The interface circuit as claimed in claim 14, wherein each of the first set of transistors and the second set of transistors comprises a first transistor and a second transistor which are coupled in series, a bulk of the first transistor and a bulk of the second transistor are coupled together to receive the reference voltage.

17. The interface circuit as claimed in claim 15, wherein the reference-voltage generation circuit comprises:
a first resistor, a first terminal of the first resistor coupled between the second transistor and the third transistor in the first set of transistors; and
a second resistor, a first terminal of the second resistor coupled between the second transistor and the third transistor in the second set of transistors,
wherein a joint node of the second terminal of the first resistor and the second terminal of the second resistor is coupled to a reference-voltage output terminal which is used to output the reference voltage.

18. The interface circuit as claimed in claim 15, wherein when the interface circuit is not powered and another interface circuit which is powered is coupled to the interface circuit, the first transistor, the third transistor, and the fourth transistor in each of the first set of transistors and the second set of transistors are turned on, and the second transistor in each of the first set of transistors and the second set of transistors is turned off.

19. The interface circuit as claimed in claim 16, wherein when the interface circuit is not powered and another interface circuit which is powered is coupled to the interface circuit, the first transistor is turned on, and the second transistor is turned off.

20. The interface circuit as claimed in claim 14, wherein the reference-voltage generation circuit comprises:
a first resistor coupled to the first output terminal;
a second resistor coupled between the first resistor and the second output terminal; and
a third set of transistors coupled between a voltage source and a joint node between the first resistor and the second resistor,
wherein the third set of transistors comprises a first transistor, a second transistor, a third transistor, and a fourth transistor which are coupled in series, a bulk of the first transistor and a bulk of the second transistor are coupled to a drain of the second transistor, and a bulk of the third transistor and a bulk of the fourth transistor are coupled to a source of the third transistor, and
wherein a joint node between the second transistor and the third transistor is coupled to a reference-voltage output terminal which is used to the reference voltage.

* * * * *